United States Patent [19]

Roumiguieres et al.

[11] 4,389,094

[45] Jun. 21, 1983

[54] PROCESS FOR CASTING ON A SUPPORT THE FAITHFULL REPRODUCTION OF A MASK PIERCED WITH PERIODICALLY DISTRIBUTED SLITS

[75] Inventors: Jean-Louis A. Roumiguieres, 69 boulevard Desgranges, 92330 Sceaux, France; Michel J. Neviere, Marseilles, France

[73] Assignee: Jean-Louis A. Roumiguieres, Sceaux, France

[21] Appl. No.: 184,265

[22] Filed: Sep. 5, 1980

[30] Foreign Application Priority Data

Sep. 10, 1979 [FR] France .................................. 79 22554

[51] Int. Cl.³ .................................................. G02B 5/18
[52] U.S. Cl. ................................. 350/162.17; 350/320
[58] Field of Search ........................... 350/162 R, 320

[56] References Cited

U.S. PATENT DOCUMENTS

| 1,744,642 | 1/1930 | Kondo | 350/162 R |
| 3,680,945 | 8/1972 | Sheridon | 350/162 R |
| 4,132,479 | 1/1979 | Dubroeucq et al. | 350/162 R |

FOREIGN PATENT DOCUMENTS 361598  1/1973  U.S.S.R. ......................... 350/162 R

*Primary Examiner*—Bruce Y. Arnold
*Attorney, Agent, or Firm*—Oblon, Fisher, Spivak, McClelland & Maier

[57] ABSTRACT

A process is disclosed which consists of choosing the wavelength of a plane incident wave to lie in the range $2d/3 \leq \lambda \leq 2d$, where $d$ is the pitch of the slits so that there exist only two diffracted orders for each of the two half-spaces which are situated on each side of the plane of the mask, and in adjusting the angle of incidence of the plane wave so that the reflected diffracted order which is not the specularly reflected order is propagated in the direction opposite that of the incident wave.

3 Claims, 3 Drawing Figures

PROCESS FOR CASTING ON A SUPPORT THE FAITHFULL REPRODUCTION OF A MASK PIERCED WITH PERIODICALLY DISTRIBUTED SLITS

BACKGROUND OF THE INVENTION

1. Field of the Invention

The present invention relates to a process for obtaining on a support a cast shadow faithfully reproducing a mask pierced with fine periodically distributed parallel slits, in which the mask is illuminated with a flat monochromatic wave which is polarized perpendicularly to its plane of incidence so that the electric field vector is parallel to the slits.

2. Description of the Prior Art

Presently, it is very difficult to provide a faithful reproduction of a mask pierced with very fine slits on a mask. When a mask of this type is illuminated, there occur in fact numerous parasite diffractions which prevent reproduction on the support of a cast shadow which corresponds faithfully to the mask and which has perfectly contrasted contours.

SUMMARY OF THE INVENTION

The present invention proposes remedying these disadvantages and, for this, it provides a process which is characterized in that it consists in choosing the wavelength of the plane incident wave so that there exist only two diffracted orders for each of the two half-spaces which are situated on each side of the plane of the mask, and in adjusting the angle of incidence of the plane wave so that the reflected diffracted order which is not the specularly reflected order is propagated in the opposite direction to that of the incident wave.

Owing to these arrangements, the parasite diffractions are now removed, which allows then a cast shadow to be obtained which is the faithfully and perfectly contrasted reproduction of the mask.

It is furthermore possible to place the support at a reasonable distance from the mask and thus to overcome the constraints and disadvantages resulting from the contacting of these two elements.

It should further be noted that the material forming the mask may be any material whatsoever and that its reflectivity may descend to low values, provided that the thickness of the mask is sufficient.

In accordance with a particular feature of the process of the invention, the slits of the mask may have an arbitrary cross-section. Laboratory tests have in fact shown that the shape of the walls of the slits has no influence on the quality of the cast shadow obtained on the support. The cutting out of the slits does not then have to be carried out with extreme accuracy, which simplifies manufacture of the mask while making it less expensive.

When the mask comprises slits distributed periodically with a pitch d, the process of the invention proposes the use of a plane monochromatic wave whose wavelength is between about (2d/3 and about 2d.

The process of the invention has very varied industrial applications. It may for example be used in the field of photolithography, in the techniques for manufacturing integrated circuits for electronics and integrated optics, in certain charge coupling circuits for constructing delay lines, the reproduction of diffraction networks used not only for reflection but also for transmission, the reproduction of network couplers for integrated optics, etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
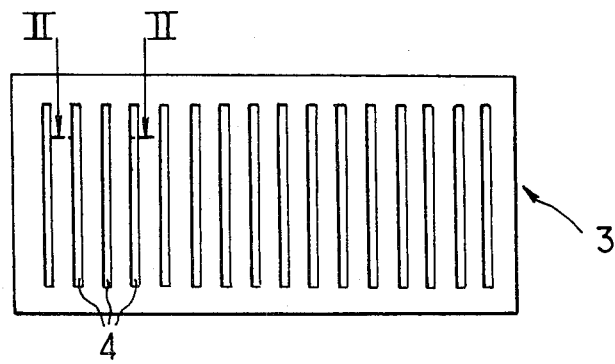
FIG. 1 is a top view of a mask which can be faithfully reproduced by use of the process of the invention.
Figure 2:
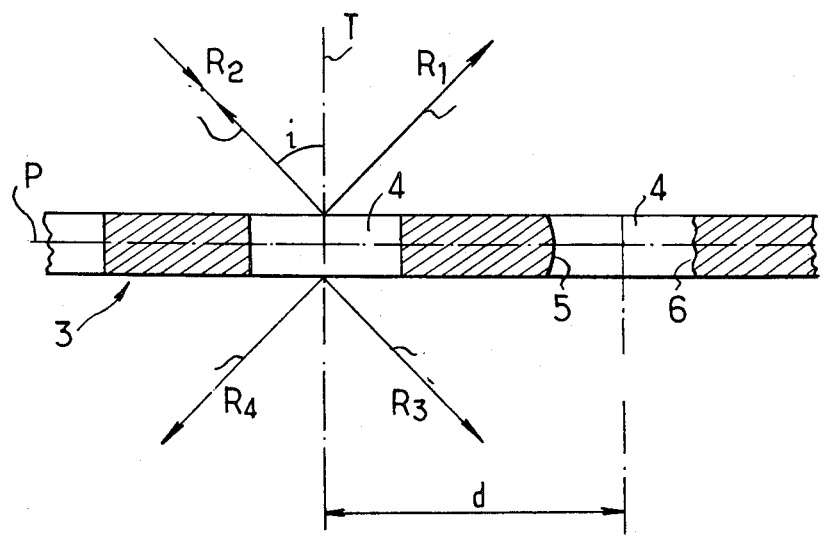
FIG. 2 is a partial sectional view on a larger scale along line II—II of FIG. 1, one of the slits of the mask being illuminated in accordance with the teachings of the process of the invention.

The process in accordance with the invention has been perfected by taking inspiration from so-called LITTROW or BRAGG assemblies to obtain a support 1, covered for example with a photosensitive layer 2, a cast shadow reproducing faithfully a mask 3 pierced with fine parallel slits 4. In the example shown in the drawing, slits 4 are rectilinear and have been formed with a constant pitch d. Referring in particular to FIG. 2, it will be noticed that the walls of these slits may have any shape whatsoever with designated references 5 and 6 being merely examples.

To implement the process in accordance with the invention, mask 3 is, first of all, illuminated with a plane monochromatic wave whose plane of incidence, which corresponds to the plane of the drawing, is perpendicular to the direction of slits 4. This monochromatic wave is polarized perpendicularly to its plane of incidence so that its electric field vector is parallel to the slits. As far as its wavelength $\lambda$ is concerned, it is chosen as a function of the pitch of the slits so that there only exist two diffracted orders for each one of the two half-spaces defined by each slit and situated on each side of the mean plane P of the mask. Referring to FIG. 2 in which this condition is satisfied, it will be noticed that there exist effectively only two reflected diffracted orders and two transmitted diffracted orders, the two reflected orders being symbolized by the rays $R_1$ and $R_2$ situated above the mask whereas the two transmitted orders are symbolized by the rays $R_3$ and $R_4$ situated below the mask.

After choosing the wavelength of the flat monochromatic wave, the angle of incidence i is then adjusted so that the reflected order $-1$ (symbolized by ray $R_2$ and which is not the specularly reflected order 0, which is symbolized by ray $R_1$) is propagated in the direction opposite to the incident wave. By this adjustment, two plane waves, one of order 0 (symbolized by ray $R_3$) and the other of order $-1$ (symbolized by ray $R_4$) are obtained in transmission. These two waves, which are of the same amplitude and the same phase, are propagated in symmetrical directions with respect to plane T extending perpendicular to mean plane P.

The flat waves obtained in transmission at the output of each slit interfere then with each other, while generating on support 1 dark 7 and light 8 zones faithfully reproducing the mask, and presenting a maximum contrast. It should be noted that the shadow of the mask is cast on the support with perfect directivity even when the mask and the support are separated from each other.

In a LITTROW assembly, the order $-1$ reflected in the air is obtained when:

$$2 \sin i = \lambda/d$$

i.e. when:

$$\sin i = \lambda/2d \qquad (1)$$

Furthermore, two orders reflected in the air are obtained when $3 \sin i > 1$, i.e. when:

$$\sin i > 1/3 \qquad (2)$$

that is:

$$i > 19° 28'$$

Determination of the wavelength $\lambda$ as a function of the pitch of the slits of the mask is obtained from formulae (1) and (2). The first formula prescribes in fact that $(\lambda/2d)$ is less than or equal to 1, and so that:

$$\lambda \leq 2d$$

If we now replace $\sin i$ in formula (2) by its value given by formula (1), it can be seen that it is also necessary for:

$$\lambda \geq 2d/3$$

Finally, it is then necessary for the wavelength of the flat monochromatic wave to satisfy the relationship:

$$(2d/3) \leq \lambda \leq 2d \qquad (3)$$

Figure 3:
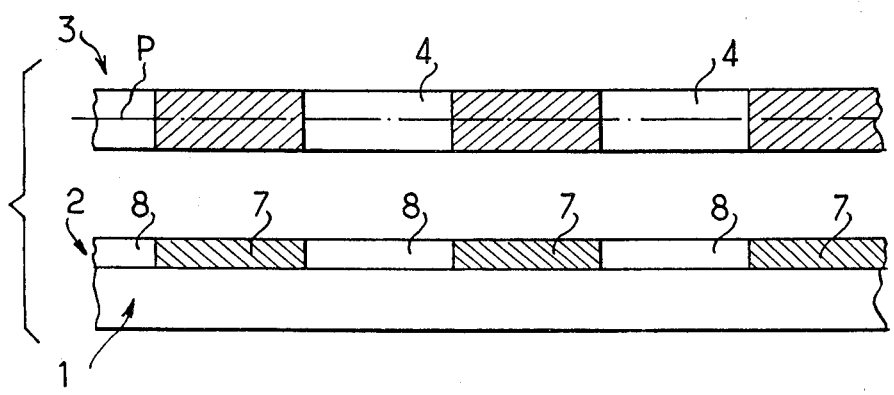
FIG. 3 is a partial enlarged view similar to FIG. 2 and showing the shadow of the mask cast on a support covered with a photosensitive layer.

The process in accordance with the invention has numerous industrial applications. It may for example be used for printing a photosensitive layer such as layer 2 visible in FIG. 3, but it may also be used for manufacturing integrated circuits, for constructing delay lines and charge coupling circuits (C.C.D.) or for reproducing diffraction networks and network couplers.

These applications of the invention use conventional techniques, but the invention allows these techniques to be used for obtaining products whose pitch may go down as far as 0.2 microns, whereas in the prior art it has not been possible to go below 1 or 2 microns and still maintain a reasonable price.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for obtaining a cast shadow reproduction of a mask on a support wherein the mask is pierced with fine periodically distributed parallel slits, comprising the steps of:
    illuminating said mask with a plane monochromatic wave which is polarized perpendicular to its plane of incidence so that the electric field vector is parallel to said slits;
    choosing the wavelength of said plane incident wave so that there exist only two diffracted orders, one for each one of two half-spaces which are situated on each side of the mean plane of the mask; and
    adjusting the angle of incidence of said plane wave so that the $-1$ reflected order is propagated in the direction opposite to the direction of the incident wave.

2. A process for obtaining a cast shadow reproduction of a mask on a support wherein the mask is pierced with fine periodically distributed parallel slits having a pitch designated by d, comprising the steps of:
    illuminating said mask with a plane monochromatic wave of wavelength $\lambda$ which is polarized perpendicular to its plane of incidence so that the electric field vector is parallel to said slits and wherein $\lambda$ is in the range 2d/3 and 2d; and,
    adjusting the angle of incidence of said plane wave so that the $-1$ reflected order is propagated in the direction opposite to the direction of the incident wave.

3. The process as claimed in claim 1 or 2 wherein said mask has slits having an arbitrary cross-section.

* * * * *